United States Patent
Kao et al.

(10) Patent No.: US 12,051,646 B2
(45) Date of Patent: Jul. 30, 2024

(54) METAL LINE STRUCTURE AND METHOD

(71) Applicant: Taiwan Semiconductor Manufacturing Co., Ltd., Hsinchu (TW)

(72) Inventors: Hsiang-Lun Kao, Taoyuan (TW); Hsiang-Wei Liu, Tainan (TW); Tai-I Yang, Hsinchu (TW); Jian-Hua Chen, Hsinchu (TW); Yu-Chieh Liao, Taoyuan (TW); Yung-Chih Wang, Taoyuan (TW); Tien-Lu Lin, Hsinchu (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 523 days.

(21) Appl. No.: 17/402,897

(22) Filed: Aug. 16, 2021

(65) Prior Publication Data

US 2021/0375760 A1    Dec. 2, 2021

Related U.S. Application Data

(60) Continuation of application No. 16/591,227, filed on Oct. 2, 2019, now Pat. No. 11,101,216, which is a continuation of application No. 15/442,282, filed on Feb. 24, 2017, now Pat. No. 10,490,500, which is a division of application No. 14/334,929, filed on Jul. 18, 2014, now Pat. No. 9,583,434.

(51) Int. Cl.
*H01L 23/528* (2006.01)
*H01L 21/263* (2006.01)
(Continued)

(52) U.S. Cl.
CPC ...... *H01L 23/5283* (2013.01); *H01L 21/2633* (2013.01); *H01L 21/31111* (2013.01); *H01L 21/7682* (2013.01); *H01L 21/76879* (2013.01); *H01L 21/76885* (2013.01); *H01L 23/5222* (2013.01); *H01L 23/5226* (2013.01); *H01L 23/528* (2013.01); *H01L 23/53295* (2013.01);
(Continued)

(58) Field of Classification Search
CPC ........... H01L 21/7682; H01L 21/76834; H01L 21/76879; H01L 21/76885; H01L 23/5226; H01L 23/528; H01L 23/5283
See application file for complete search history.

(56) References Cited

U.S. PATENT DOCUMENTS 5,641,712 A    6/1997  Grivna et al.
6,274,483 B1   8/2001  Chang et al.
(Continued)

FOREIGN PATENT DOCUMENTS

CN    102263083 A    11/2011
WO    2013101096 A1   7/2013

*Primary Examiner* — Raj R Gupta
(74) *Attorney, Agent, or Firm* — Slater Matsil, LLP

(57) ABSTRACT

A method comprises forming a first conductive line and a second conductive line in a first dielectric layer over a substrate, each having a planar top surface, applying an etch-back process to the first dielectric layer until a dielectric portion between the first conductive line and the second conductive line has been removed, and the first conductive line and the second conductive line have respective cross sectional shapes including a rounded surface and two rounded corners and depositing a second dielectric layer over the substrate, while leaving a first air gap between the first conductive line and the second conductive line.

20 Claims, 20 Drawing Sheets

(51) Int. Cl.
  *H01L 21/311* (2006.01)
  *H01L 21/768* (2006.01)
  *H01L 23/522* (2006.01)
  *H01L 23/532* (2006.01)

(52) U.S. Cl.
  CPC ............... *H01L 21/76834* (2013.01); *H01L 2924/0002* (2013.01)

(56) References Cited

U.S. PATENT DOCUMENTS

| | | | |
|---|---|---|---|
| 6,586,842 | B1 | 7/2003 | You et al. |
| 8,141,235 | B1 | 3/2012 | Zhang |
| 10,748,812 | B1* | 8/2020 | Cheng ............... H01L 23/53209 |
| 2002/0074540 | A1 | 6/2002 | Yokoyama |
| 2006/0214191 | A1* | 9/2006 | Nishimura ........ H01L 21/76885 257/E21.589 |
| 2008/0299763 | A1 | 12/2008 | Ueki et al. |
| 2009/0121356 | A1 | 5/2009 | Nakagawa |
| 2009/0263951 | A1 | 10/2009 | Shibata et al. |
| 2009/0294898 | A1 | 12/2009 | Feustel et al. |
| 2011/0189833 | A1 | 8/2011 | Sawada |
| 2011/0198757 | A1 | 8/2011 | Su et al. |
| 2012/0319279 | A1 | 12/2012 | Isobayashi |
| 2015/0037980 | A1 | 2/2015 | Rha et al. |
| 2015/0262860 | A1* | 9/2015 | Kao ................... H01L 23/53295 438/653 |
| 2015/0371940 | A1* | 12/2015 | Liu ................... H01L 21/76834 257/750 |

* cited by examiner

METAL LINE STRUCTURE AND METHOD

PRIORITY CLAIM AND CROSS-REFERENCE

This application is a continuation of U.S. patent application Ser. No. 16/591,227, filed on Oct. 2, 2019 (now U.S. Pat. No. 11,101,216, issuing Aug. 24, 2021), and entitled "Metal Line Structure and Method," which is a continuation of U.S. patent application Ser. No. 15/442,282, filed on Feb. 24, 2017 (now U.S. Pat. No. 10,490,500, issued Nov. 26, 2019), and entitled "Metal Line Structure and Method," which is a divisional of U.S. patent application Ser. No. 14/334,929, filed Jul. 18, 2014 (now U.S. Pat. No. 9,583,434, issued Feb. 28, 2017), and entitled "Metal Line Structure and Method," which applications are incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

As semiconductor technologies evolve, wafer-level chip scale package structures have emerged as an effective alternative to further reduce the physical size of semiconductor devices. In a wafer-level chip scale package structure, active devices such as transistors and the like are formed at the top surface of a substrate of the wafer-level chip scale package structure. A variety of metallization layers comprising interconnect structures are formed over the substrate. Interconnection structures of a semiconductor device may comprise a plurality of lateral interconnections such as metal lines and a plurality of vertical interconnections such as vias, plugs and/or the like. The metal lines of the metallization layers are separated by dielectric layers. Trenches and vias are formed in the dielectric layers to provide an electrical connection between metal lines. Various active circuits of a semiconductor device may be coupled to external circuits through a variety of conductive channels formed by the vertical and lateral interconnections.

The metal lines and vias may be formed of copper. In order to prevent interference such as capacitive coupling between two adjacent metal lines from having an impact on the overall performance of the semiconductor device, low-K dielectric materials may be filled between adjacent metal lines. The low-K dielectric materials may be of a dielectric constant approximately equal to and less than 4.0. Such low-K dielectric materials help to reduce the capacitive coupling between two adjacent metal lines so as to improve the overall performance characteristics of the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF ILLUSTRATIVE EMBODIMENTS

Figure 1:
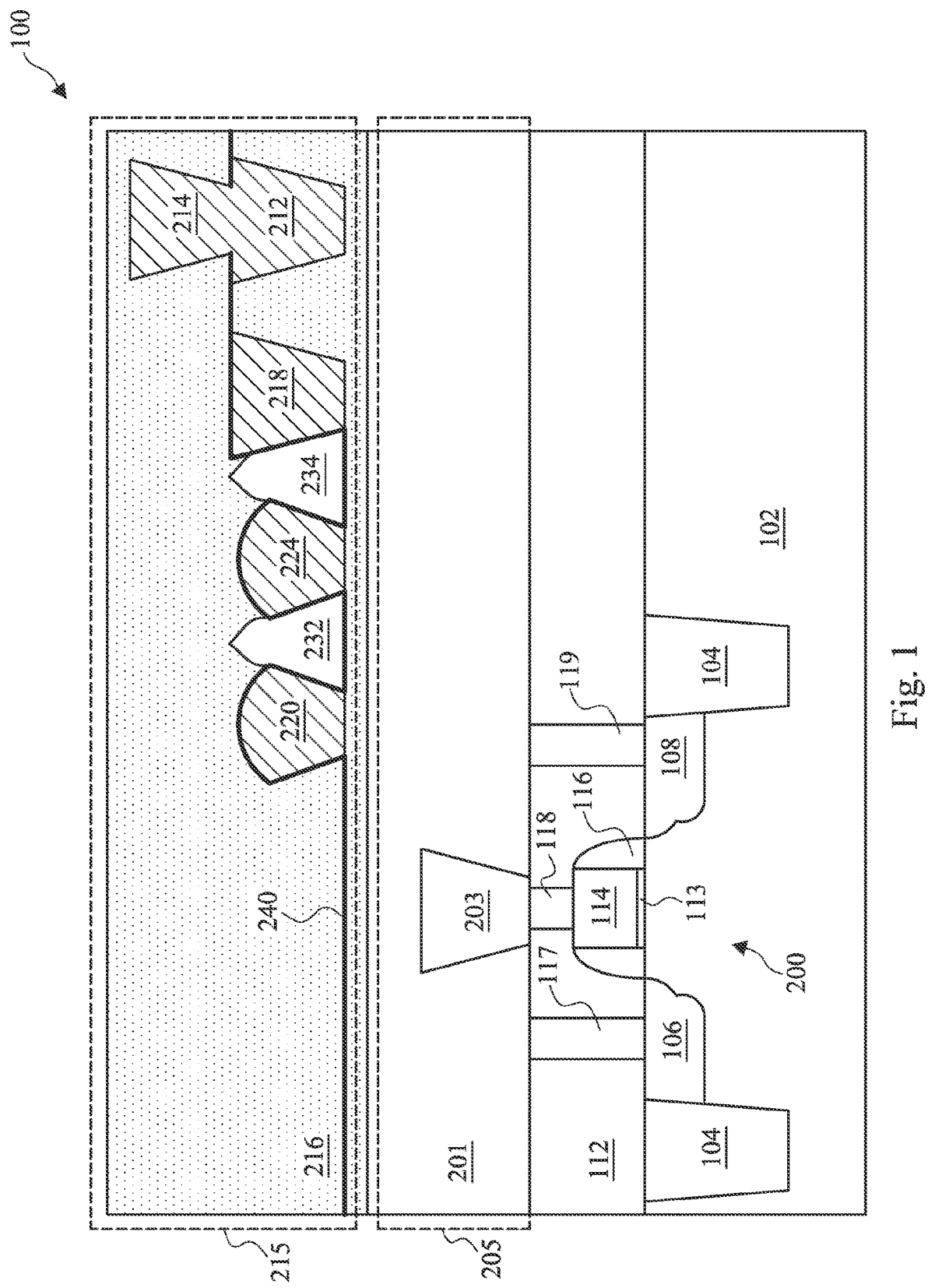
FIG. 1 illustrates a cross sectional view of a semiconductor device in accordance with various embodiments of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 illustrates a cross sectional view of a semiconductor device in accordance with various embodiments of the present disclosure. The semiconductor device 100 includes a transistor device 200, which is formed in a substrate 102 and a plurality of interconnect structures formed over the substrate 102.

The substrate 102 may be formed of silicon, although it may also be formed of other group III, group IV, and/or group V elements, such as silicon, germanium, gallium, arsenic, and combinations thereof. The substrate 102 may also be in the form of silicon-on-insulator (SOI). The SOI substrate may comprise a layer of a semiconductor material (e.g., silicon, germanium and/or the like) formed over an insulator layer (e.g., buried oxide or the like), which is formed in a silicon substrate. In addition, other substrates that may be used include multi-layered substrates, gradient substrates, hybrid orientation substrates and/or the like.

The substrate 102 may further comprise a variety of electrical circuits such as metal oxide semiconductor (MOS) transistors (e.g., transistor device 200) and the associated contact plugs (e.g., contact plug 118). The electrical circuits formed on the substrate 102 may be any type of circuitry suitable for a particular application. In accordance with an embodiment, the electrical circuits may include various n-type metal-oxide semiconductor (NMOS) and/or p-type metal-oxide semiconductor (PMOS) devices such as transistors, capacitors, resistors, diodes, photo-diodes, fuses and/or the like. The electrical circuits may be interconnected to perform one or more functions. The functions may include memory structures, processing structures, sensors, amplifiers, power distribution, input/output circuitry and/or the like. One of ordinary skill in the art will appreciate that the above examples are provided for illustrative purposes only and are not intended to limit the various embodiments to any particular applications.

As shown in FIG. 1, the transistor device 200 includes a first drain/source region 106 and a second drain/source region 108. The first drain/source region 106 and the second drain/source region 108 are formed on opposite sides of a gate structure of the transistor device 200. The gate structure is formed in a dielectric layer 112 and over the substrate 102. The gate structure may comprise a gate dielectric layer 113, a gate electrode 114 over the gate dielectric layer 113 and spacers 116.

The gate dielectric layer 113 may be a dielectric material such as silicon oxide, silicon oxynitride, silicon nitride, an oxide, a nitrogen-containing oxide, a combination thereof and/or the like. The gate dielectric layer 113 may have a relative permittivity value greater than about 4. Other examples of such materials include aluminum oxide, lanthanum oxide, hafnium oxide, zirconium oxide, hafnium oxynitride, any combinations thereof and/or the like. In an embodiment in which the gate dielectric layer 113 comprises an oxide layer, the gate dielectric layer 113 may be formed by suitable deposition processes such as a plasma enhanced chemical vapor deposition (PECVD) process using tetraethoxysilane (TEOS) and oxygen as a precursor. In accordance with an embodiment, the gate dielectric layer 113 may be of a thickness in a range from about 8 Angstroms to about 200 Angstroms.

The gate electrode 114 may comprise a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, combinations thereof and/or the like. In an embodiment in which the gate electrode 114 is formed of poly-silicon, the gate electrode 114 may be formed by depositing doped or undoped poly-silicon by low-pressure chemical vapor deposition (LPCVD) to a thickness in the range of about 400 Angstroms to about 2,400 Angstroms.

The spacers 116 may be formed by blanket depositing one or more spacer layers (not shown) over the gate electrode 114 and the substrate 102. The spacers 116 may comprise suitable dielectric materials such as SiN, oxynitride, SiC, SiON, oxide and/or the like. The spacers 116 may be formed by commonly used techniques such as chemical vapor deposition (CVD), PECVD, sputtering and/or the like.

The first and second drain/source regions 106 and 108 may be formed in the substrate 102 on opposing sides of the gate dielectric layer 113. In an embodiment in which the substrate 102 is an n-type substrate, the first and second drain/source regions 106 and 108 may be formed by implanting appropriate p-type dopants such as boron, gallium, indium and/or the like. Alternatively, in an embodiment in which the substrate 102 is a p-type substrate, the first and second drain/source regions 106 and 108 may be formed by implanting appropriate n-type dopants such as phosphorous, arsenic and/or the like.

As shown in FIG. 1, there may be two isolation regions formed on opposite sides of the transistor device 200. The isolation regions 104 may be shallow trench isolation (STI) regions. The STI regions may be formed by etching the substrate 102 to form a trench and filling the trench with a dielectric material as is known in the art. For example, the isolation regions 104 may be filled with a dielectric material such as an oxide material, a high-density plasma (HDP) oxide and/or the like. A planarization process such as a chemical mechanical planarization (CMP) process may be applied to the top surface so that the excess dielectric material may be removed as a result.

The dielectric layer 112 is formed on top of the substrate 102. The dielectric layer 112 may be formed, for example, of a low-K dielectric material, such as silicon oxide. The dielectric layer 112 may be formed by any suitable method known in the art, such as spinning, CVD and PECVD. It should also be noted that one skilled in the art will recognize while FIG. 1 illustrates a single dielectric layer, the dielectric layer 112 may comprise a plurality of dielectric layers.

As shown in FIG. 1, there may be three contact plugs 117, 118 and 119 formed in the dielectric layer 112. The contact plug 117 is formed over the first drain/source region 106. The contact plug 119 is formed over the second drain/source region 108. The contact plug 118 is formed over the gate electrode 114. These three contact plugs are used to provide an electrical connection between the transistor device 200 and the interconnect structures formed over the dielectric layer 112.

The contact plugs 117, 118 and 119 may be formed by using photolithography techniques to deposit and pattern a photoresist material (not shown) on the dielectric layer 112. Portions of the photoresist are exposed according to the location and shape of the contact plugs (e.g., contact plug 118). An etching process, such as an anisotropic dry etch process, may be used to create three openings in the dielectric layer 112.

A conductive material is then filled in the openings. The conductive material may be deposited by using CVD, plasma vapor deposition (PVD), atomic layer deposition (ALD) and/or the like. The conductive material is deposited in the contact plug openings. Excess portions of the conductive material are removed from the top surface of the dielectric layer 112 by using a planarization process such as CMP. The conductive material may be copper, tungsten, aluminum, silver, titanium, titanium nitride, tantalum and any combinations thereof and/or the like.

A first dielectric layer 201 is formed over the dielectric layer 112. In some embodiments, the first dielectric layer 201 is part of a first metallization layer 205. As shown in FIG. 1, there may be one metal line 203 formed in the first metallization layer 205. A second dielectric layer 216 is formed over the first dielectric layer 201. The second dielectric layer 216 is part of a second metallization layer 215.

While FIG. 1 shows one metallization layer (e.g., the second metallization layer 215) formed over the first metallization layer 205, one skilled in the art will recognize that more inter-metal dielectric layers (not shown) and the associated metal lines and vias (not shown) may be formed over the metallization layer 215. In particular, the additional layers may be formed by alternating layers of dielectric (e.g., extremely low-k dielectric material) and conductive materials (e.g., copper).

The metal lines 212, 218, 220 and 224 are formed in the second metallization layer 215. The metal lines 220 and 224 are of a rounded top surface and two rounded corners. More particularly, the metal line 220 comprises a first sidewall and a second sidewall. As shown in FIG. 1, both sidewalls of the metal line 220 are an inclined slope. A first rounded corner is between the first sidewall and the rounded top surface of the metal line 220. The second rounded corner is between the second sidewall and the rounded top surface of the metal line 220. The shape of the metal line 224 is similar to that of the metal line 220, and hence is not discussed again to avoid repetition.

As shown in FIG. 1, there may be air gaps formed in the second metallization layer 215. A first air gap 232 is formed between the metal line 220 and metal line 224. A second air gap 234 is formed between the metal line 224 and the metal line 218. The top surfaces of the first air gap 232 and the second air gap 234 are ideally of a teardrop shape as shown in FIG. 1. The detailed structure and formation process of the air gaps 232 and 234 will be described below with respect to FIGS. 2-13.

FIG. 1 further illustrates the semiconductor device 100 comprises a via 214 and an etch stop layer 240. Similar to metal lines 220, 224, 218 and 212, the via 214 is embedded in the second metallization layer 215. The via 214 is formed over the metal line 212. The bottom surface of the via 214 is in direct contact with the top surface of the metal line 212.

In some embodiments, the metal lines 212, 218, 220 and 224, and via 214 may be formed of suitable metal materials such as copper, copper alloys, aluminum, silver, tungsten, gold, any combinations thereof and/or the like.

Figure 2:
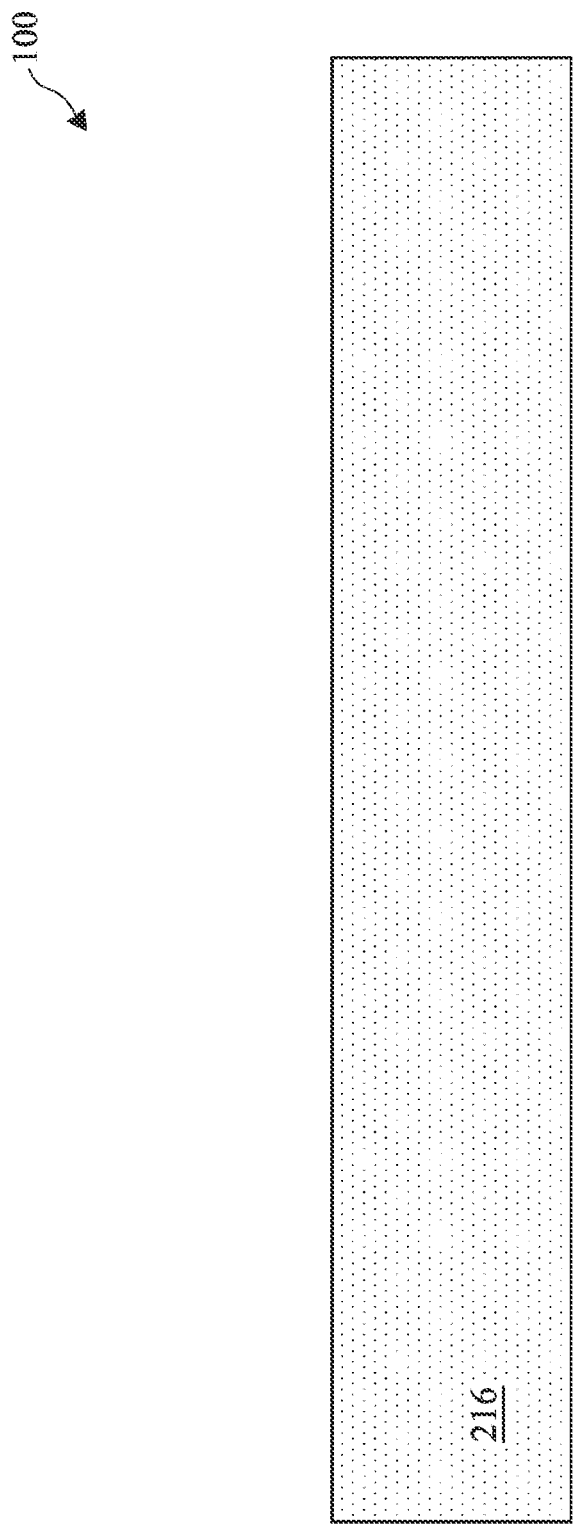
FIG. 2 illustrates a cross sectional view of a dielectric layer in accordance with various embodiments of the present disclosure.

FIGS. 2 to 13 illustrate intermediate steps of fabricating the semiconductor device shown in FIG. 1 in accordance with various embodiments of the present disclosure. FIG. 2 illustrates a cross sectional view of a dielectric layer in accordance with various embodiments of the present disclosure. The dielectric layer 216 may be formed of a low-K dielectric material such as fluorosilicate glass (FSG) and/or the like. The dielectric layer 216 may be formed by suitable deposition techniques such as PECVD techniques, high-density plasma chemical vapor deposition (HDPCVD) and/or the like. It should be noted other features of the semiconductor device 100 shown in FIG. 1 are omitted form FIG. 2 for clarity.

Figure 3:
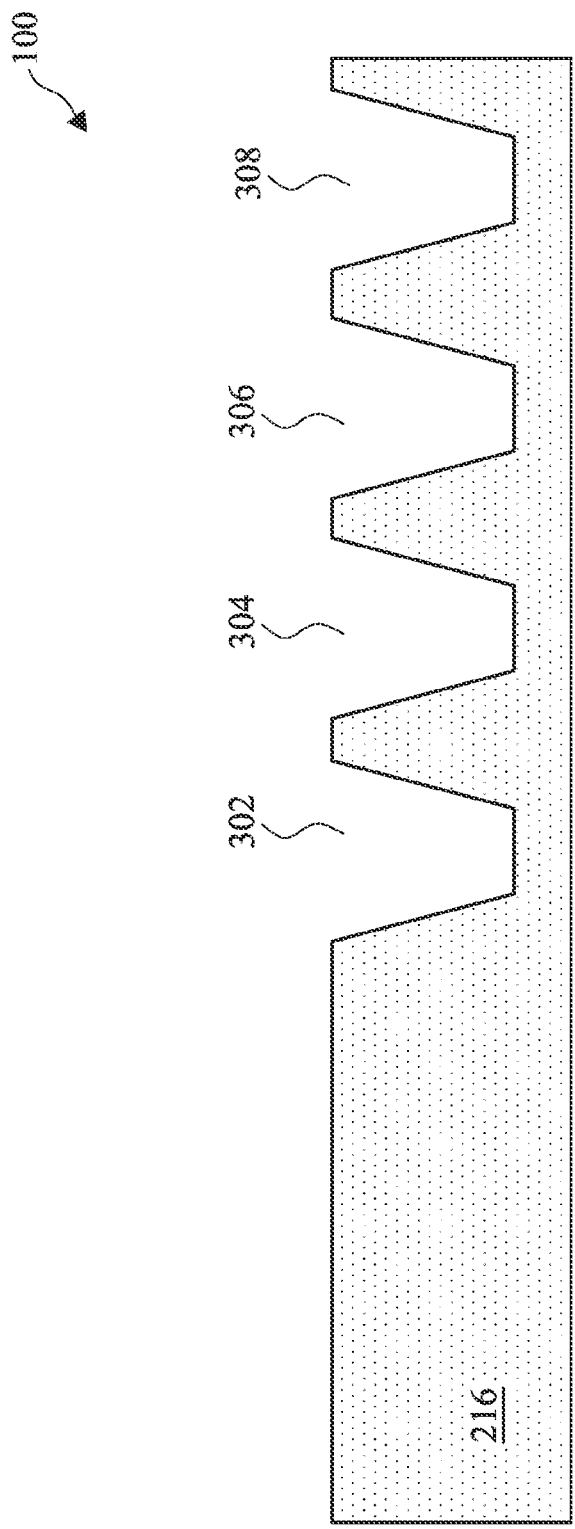
FIG. 3 illustrates a cross sectional view of the semiconductor device shown in FIG. 2 after a plurality of openings are formed in the dielectric layer in accordance with various embodiments.

FIG. 3 illustrates a cross sectional view of the semiconductor device shown in FIG. 2 after a plurality of openings are formed in the dielectric layer in accordance with various embodiments. According to the location of the metal lines shown in FIG. 1, openings 302, 304, 306 and 308 are formed in the dielectric layer 216. The openings 302, 304, 306 and 308 may be formed by any suitable semiconductor patterning techniques such as an etching process, a laser ablation process and/or the like. For example, the openings 302, 304, 306 and 308 may be formed by using photolithography techniques to deposit and pattern a photoresist material (not shown) on the dielectric layer 216. Portions of the photoresist are exposed according to the location and shape of the metal lines shown in FIG. 1. An etching process, such as an anisotropic dry etch process, may be used to form the openings 302, 304, 306 and 308 in the dielectric layer 216.

Figure 4:
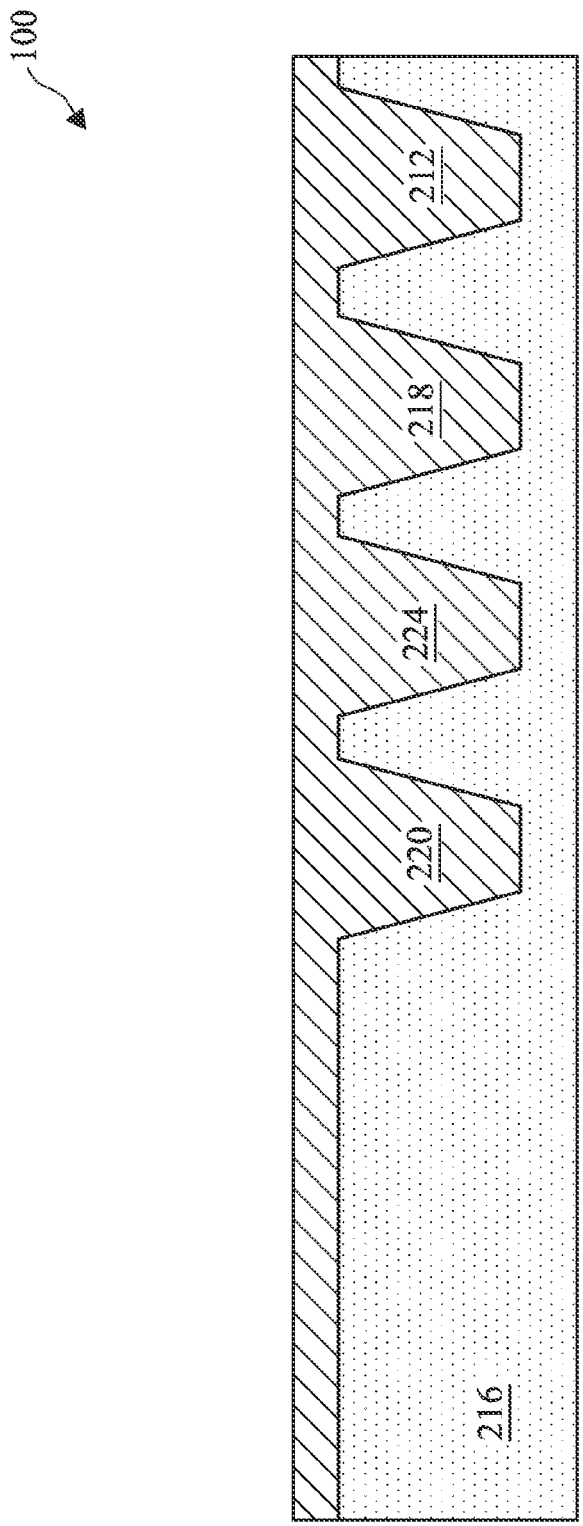
FIG. 4 illustrates a cross sectional view of the semiconductor device shown in FIG. 3 after a conductive material is filled in the openings in accordance with various embodiments of the present disclosure.

FIG. 4 illustrates a cross sectional view of the semiconductor device shown in FIG. 3 after a conductive material is filled in the openings in accordance with various embodiments of the present disclosure. In some embodiments, a seed layer (not shown) may be formed in each opening. The seed layer may be may be formed of copper, nickel, gold, any combination thereof and/or the like. The seed layer may be formed by suitable deposition techniques such as PVD, CVD and/or the like. The seed layer may have a thickness in a range from about 50 Angstroms to about 1,000 Angstroms.

In addition, the seed layer may be alloyed with a material that improves the adhesive properties of the seed layer so that it can act as an adhesion layer. For example, the seed layer may be alloyed with a material such as manganese or aluminum, which will migrate to the interface between the seed layer and the barrier layer and will enhance the adhesion between these two layers. The alloying material may be introduced during formation of the seed layer. The alloying material may comprise no more than about 10% of the seed layer. It should be noted that other layers such as barrier layers, glue layers and/or the like may also be used depending on different applications and design needs.

Once the seed layer is formed, a conductive material is then filled in the openings 302, 304, 306 and 308. The conductive material may be copper, but can be any suitable conductive materials, such as copper alloys, aluminum, tungsten, titanium, silver, any combinations thereof and/or the like. The conductive material may be formed by suitable fabrication techniques such as an electro-less plating process, CVD, electroplating and/or the like.

Figure 5:
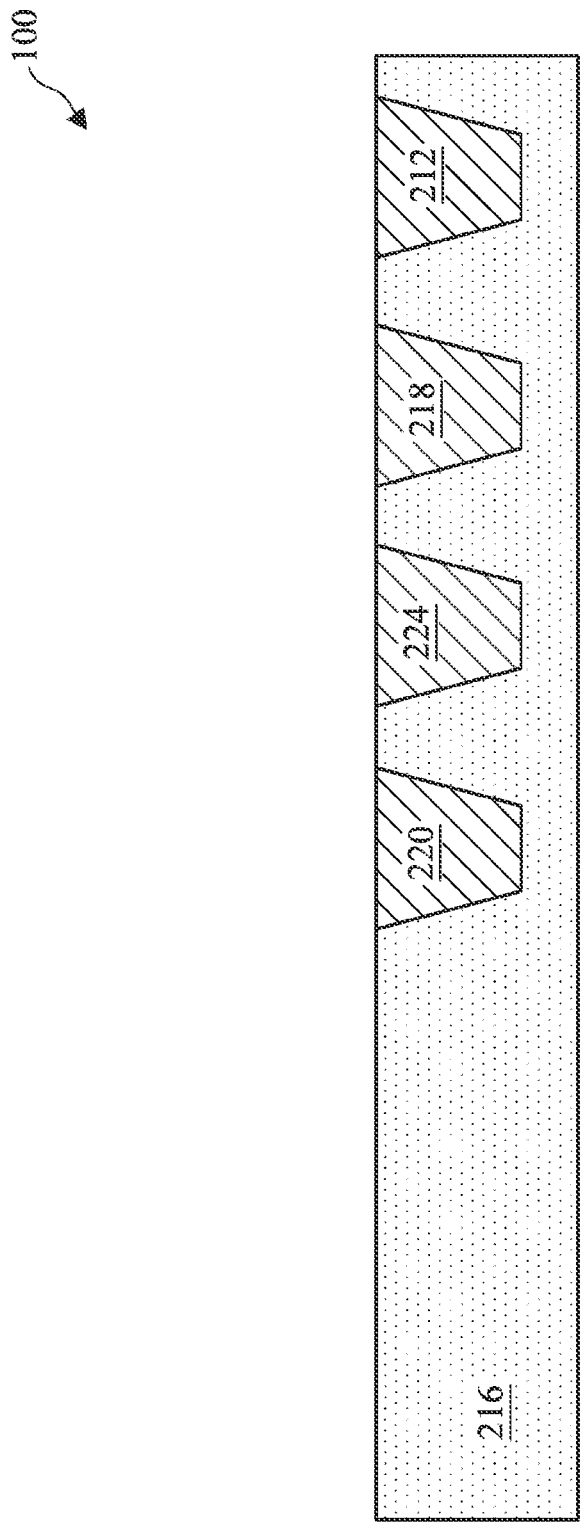
FIG. 5 illustrates a cross sectional view of the semiconductor device shown in FIG. 4 after a planarization process is performed to remove excess conductive materials in accordance with various embodiments of the present disclosure.

FIG. 5 illustrates a cross sectional view of the semiconductor device shown in FIG. 4 after a planarization process is performed to remove excess conductive materials in accordance with various embodiments of the present disclosure. The planarization process may be implemented by using suitable techniques such as grinding, polishing and/or chemical etching, a combination of etching and grinding techniques.

In accordance with various embodiments, the planarization process may be implemented by using a CMP process. In the CMP process, a combination of etching materials and abrading materials are put into contact with the top surface of the semiconductor device and a grinding pad (not shown) is used to grind away excess conductive materials until the top surface of the dielectric layer 216 is substantially level with the top surfaces of the metal lines 212, 218, 220 and 224.

As shown in FIG. 5, after the CMP process finishes, each metal line (e.g., metal line 220) is of a planar surface, a first acute corner between a first sidewall and the planar surface, and a second acute corner between a second sidewall and the planar surface. In addition, the bottom surfaces of the metal lines 212, 218, 220 and 224 are on a same level as shown in FIG. 5. Likewise, the top surfaces of the metal lines 212, 218, 220 and 224 are substantially level to each other.

Figure 6:
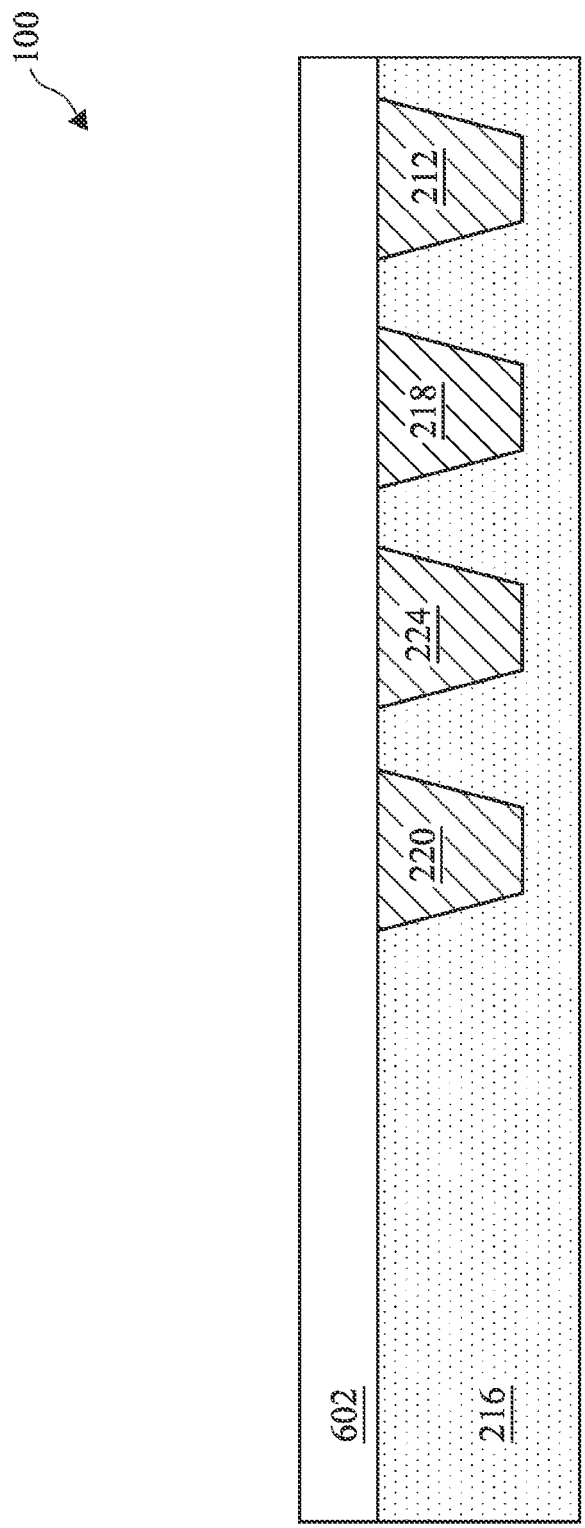
FIG. 6 illustrates a cross sectional view of the semiconductor device shown in FIG. 5 after a mask layer is formed over the dielectric layer in accordance with various embodiments of the present disclosure.

FIG. 6 illustrates a cross sectional view of the semiconductor device shown in FIG. 5 after a mask layer is formed over the dielectric layer in accordance with various embodiments of the present disclosure. The mask layer 602 may function as a hard mask during subsequent photolithography processes. Throughout the description, the mask layer 602 may be alternatively referred to as the hard mask layer 602.

In some embodiments, the hard mask layer 602 may be formed of suitable materials such as an oxide including TEOS and/or the like. In alternative embodiments, the hard mask layer 602 may be formed of a nitride such as silicon oxide, silicon oxynitride, silicon nitride and/or the like.

The hard mask layer 602 may be formed by suitable semiconductor fabrication techniques such as LPCVD, PECVD and/or the like. The hard mask layer 602 may be of a thickness in a range from about 200 Angstroms to about 1400 Angstroms.

It should be noted while FIG. 6 illustrates a single hard mask layer 602, one of ordinary skill in the art would recognize many variations, alternatives, and modifications. For example, a multi-layer hard mask, such as layers of silicon dioxide and silicon nitride, may also be used. Furthermore, other materials, such as a metal, a metal nitride, a metal oxide, or the like, may be used.

Figure 7:
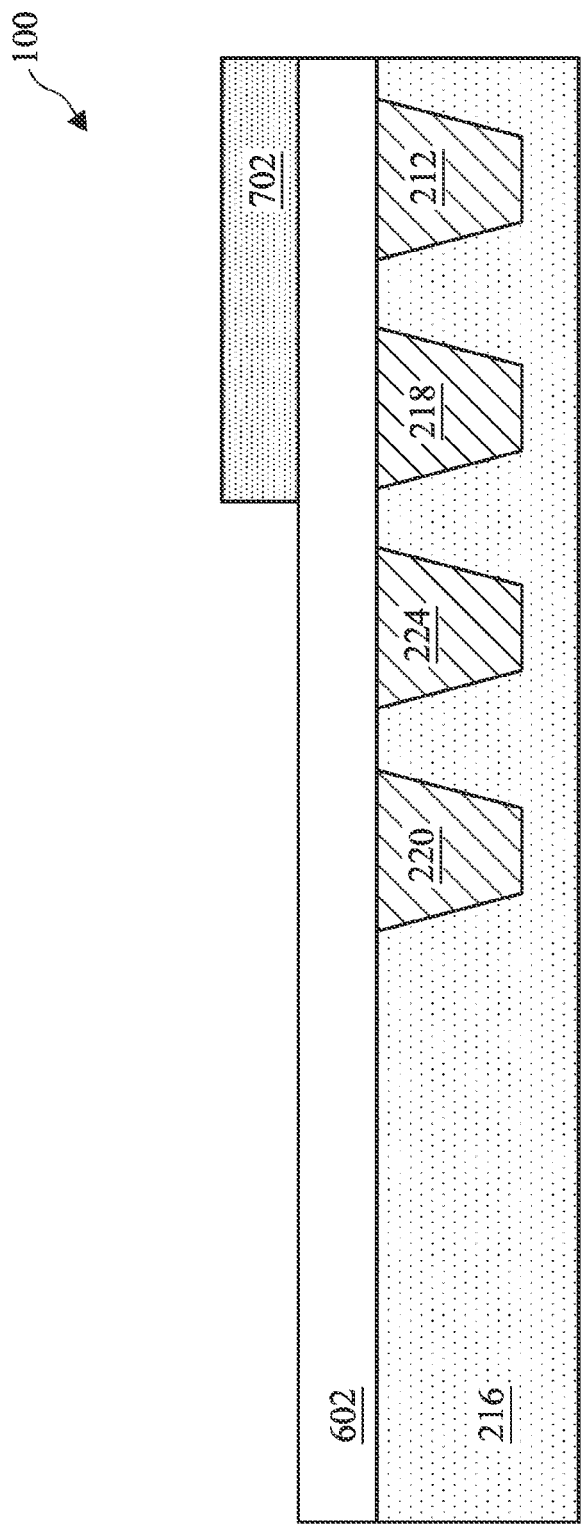
FIG. 7 illustrates a cross sectional view of the semiconductor device shown in FIG. 6 after a patterning process is applied to a photoresist layer in accordance with various embodiments of the present disclosure.

FIG. 7 illustrates a cross sectional view of the semiconductor device shown in FIG. 6 after a patterning process is applied to a photoresist layer in accordance with various embodiments of the present disclosure. The photoresist layer 702 is formed over the hard mask layer 602. The photoresist layer 702 may be formed of suitable photoresist materials such as polybenzoxazole (PBO), SU-8 photo-sensitive epoxy, film type polymer materials and/or the like.

The photoresist layer 702 may be formed by suitable fabrication techniques such as spin coating and/or the like. It should also be noted while FIG. 7 illustrates a single photoresist layer 702, one skilled in the art will recognize there may be many alternatives, variations and modifications. For example, the photoresist layer 702 may comprise a plurality of photoresist layers.

The top surface of the hard mask layer 602 may be divided into two regions, namely a via landing region and a non-via landing region. The via landing region is over the metal lines 212 and 218. The non-via landing region is over the metal lines 220 and 224. In some embodiments, the via landing region should be protected by the hard mask layer 602 during subsequent etching processes.

A patterning process is applied to the photoresist layer 702. In consideration of the location of the via landing region, selective areas of the photoresist layer 702 are exposed to light (e.g., positive photoresist), or not exposed to light (e.g., negative photoresist) depending on the nature of the photoresist layer. As a result, the photoresist material over the metal lines 220 and 224 is removed. The patterning process of the photoresist layer 702 involves lithography operations, which are well known, and hence are not discussed in further detail herein.

Figure 8:
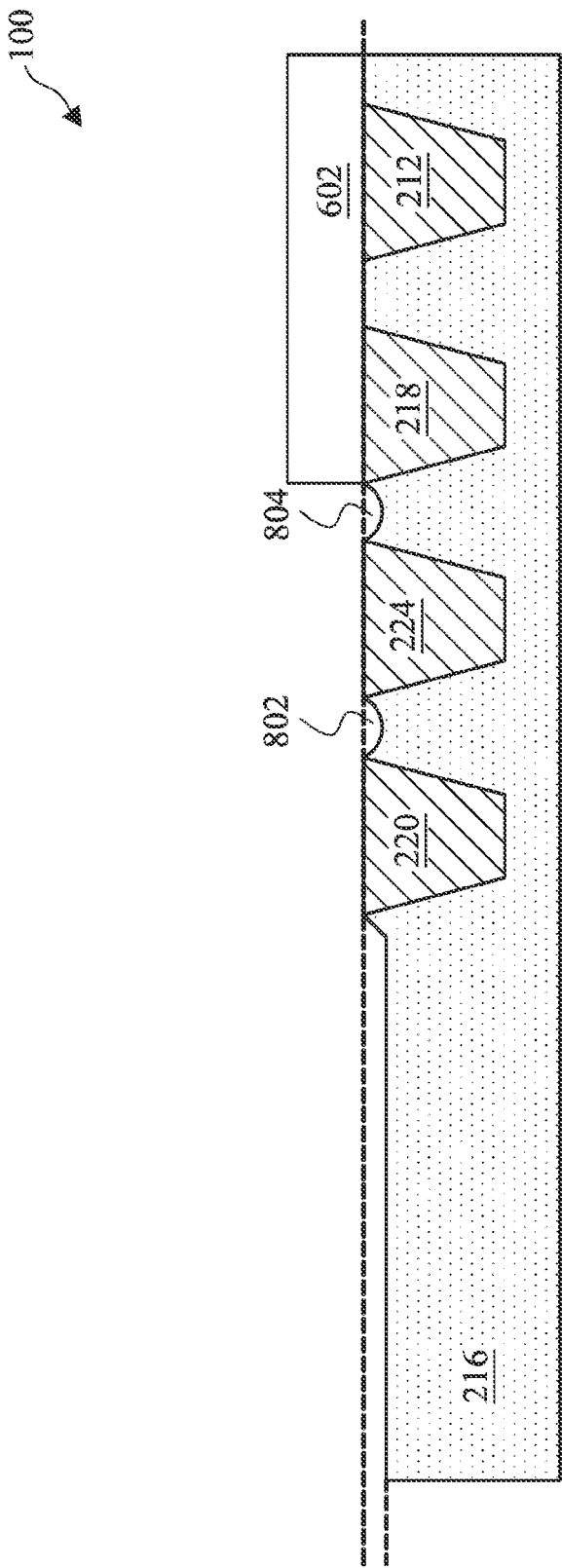
FIG. 8 illustrates a cross sectional view of the semiconductor device shown in FIG. 7 after a hard mask removal process is applied to the hard mask layer in accordance with various embodiments of the present disclosure.

FIG. 8 illustrates a cross sectional view of the semiconductor device shown in FIG. 7 after a hard mask removal process is applied to the hard mask layer in accordance with various embodiments of the present disclosure. The exposed portion of the hard mask layer 602 shown in FIG. 7 may be removed by using a suitable etching process such as wet-etching, dry-etching and/or the like. The detailed operations of either the dry etching process or the wet etching process are well known in the art, and hence are not discussed herein to avoid unnecessary repetition.

In some embodiments, the exposed portion of the hard mask layer 602 shown in FIG. 7 may be etched through to expose the dielectric layer 216 as well as the top surfaces of the metal lines 220 and 224 as shown in FIG. 8. During the hard mask removal process, portions of the dielectric layer 216 may be removed. As shown in FIG. 8, after the removal process finishes, the top surface of the exposed portion of the dielectric layer 216 is lower than the unexposed portion of the dielectric layer 216. In addition, the removal process may result in a first dip 802 between the metal line 220 and the metal line 224. Likewise, the removal process may create a second dip 804 between the metal line 224 and the metal line 218.

It should be noted that while FIG. 8 shows the top surfaces of the metal lines 220 and 224 are substantially level with the top surfaces of the metal lines 218 and 212, the removal process may recess the top surfaces of the metal lines 220 and 224 so that the remaining top surfaces of the metal lines 220 and 224 may be slightly lower than the top surfaces of the metal lines 212 and 218.

The remaining photoresist layer 702 shown in FIG. 7 may be removed by using suitable photoresist stripping techniques such as chemical solvent cleaning, plasma ashing, dry stripping and/or the like. The photoresist stripping techniques are well known and hence are not discussed in further detail herein to avoid repetition.

Figure 9:
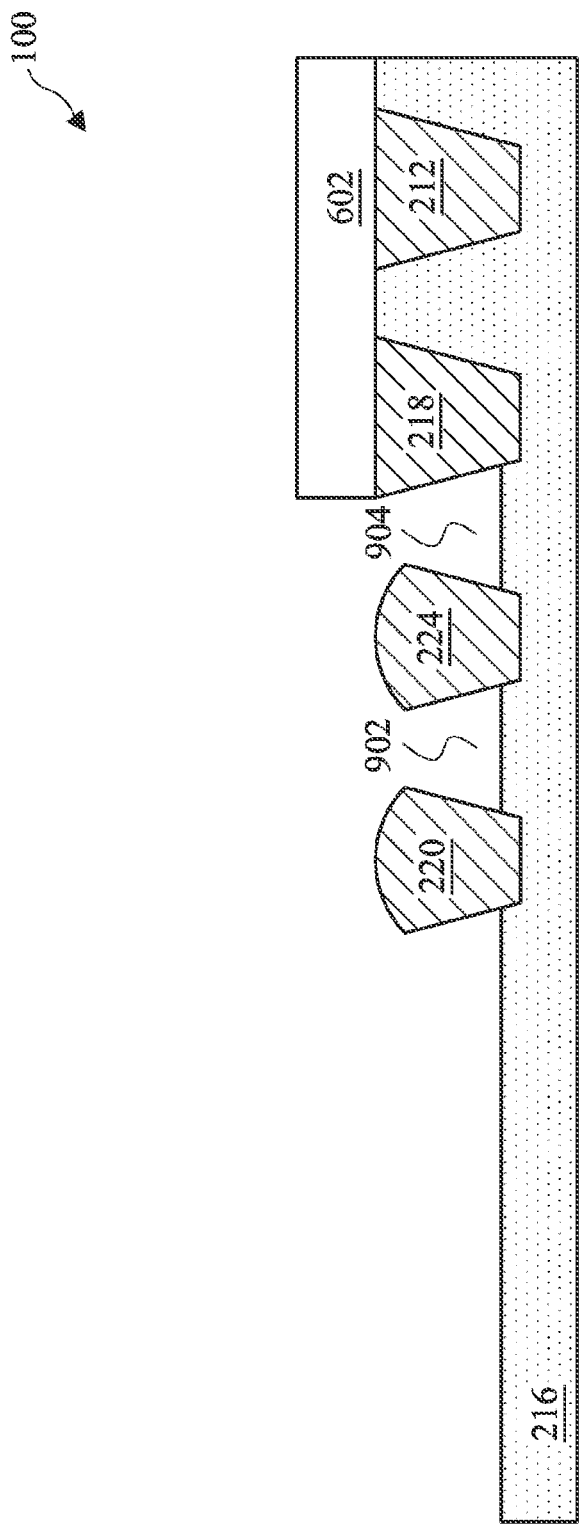
FIG. 9 illustrates a cross sectional view of the semiconductor device shown in FIG. 8 after an etch-back process is applied to the exposed dielectric layer in accordance with various embodiments of the present disclosure.

FIG. 9 illustrates a cross sectional view of the semiconductor device shown in FIG. 8 after an etch-back process is applied to the exposed dielectric layer in accordance with various embodiments of the present disclosure. In some embodiments, a suitable etching process such as sputtering, a reactive ion etching (RIE) process and/or the like may be applied to the exposed dielectric layer 216 as well as the metal lines 220 and 224.

In some embodiments, the etching process may comprise a gas including $C_xF_x$, Ar and/or the like. The gas flow of the etching process is in a range from about 1 sccm to about 100 sccm. The gas pressure of the etching process is less than 800 mTor. The power of the RF supply of the etching process is less than 3000 W.

In the etching process, a plasma is created by ionizing a sputtering gas. The sputtering gas from the plasma bombards the exposed dielectric layer 216 as well as the exposed metal lines 220 and 224. As a result, the upper portion of the exposed dielectric layer 216 has been removed to form a first opening 902 and a second opening 904 as shown in FIG. 9. Furthermore, the plasma bombardment in the etching process may function as a reshaping process, which leads to rounded metal lines 220 and 224.

As shown in FIG. 9, after the etching process finishes, the rounded metal lines 220 and 224 are of a rounded top surface and two rounded corners. The shape of rounded metal line 220 is similar to the shape of the rounded metal line 224. For simplicity, only the shape of the metal line 220 is described in detail herein.

The rounded top surface of the metal line 220 is between the first rounded corner and second rounded corner of the metal line 220. The first rounded corner of the metal line 220 may be of a first radius of curvature. The second rounded corner of the metal line 220 may be of a second radius of curvature. The rounded top surface of the metal line 220 may be of a third radius of curvature. In some embodiments, the first radius may be approximately equal to the second radius.

It should be noted that the first radius, the second radius and the third radius of the metal line 220 may vary depending on different application needs. In other words, the values of the first radius, the second radius and the third radius are a matter of choice of design.

One advantageous feature of having the fabrication step shown in FIG. 9 is the reshaping process of the metal lines 220 and 224 and the etch-back process of the dielectric layer 216 can be carried out in a single fabrication step. Such a single fabrication step helps to reduce the fabrication cost of the semiconductor device 100.

Another advantageous feature of having the fabrication step shown in FIG. 9 is that the rounded metal lines 220 and 224 may help to reduce the distance between two adjacent metal lines. Furthermore, the rounded corners of the metal lines 220 and 224 may help to reduce the electric field between metal lines 220 and 224. Such reduced overlap and electric field may help to reduce the capacitive coupling between two adjacent metal lines (e.g., metal lines 220 and 224). Such reduced capacitive coupling may help to improve a variety of reliability performance characteristics such as breakdown voltage (VBD), time dependent dielectric breakdown (TDDB), lower leakage and/or the like.

Figure 10:
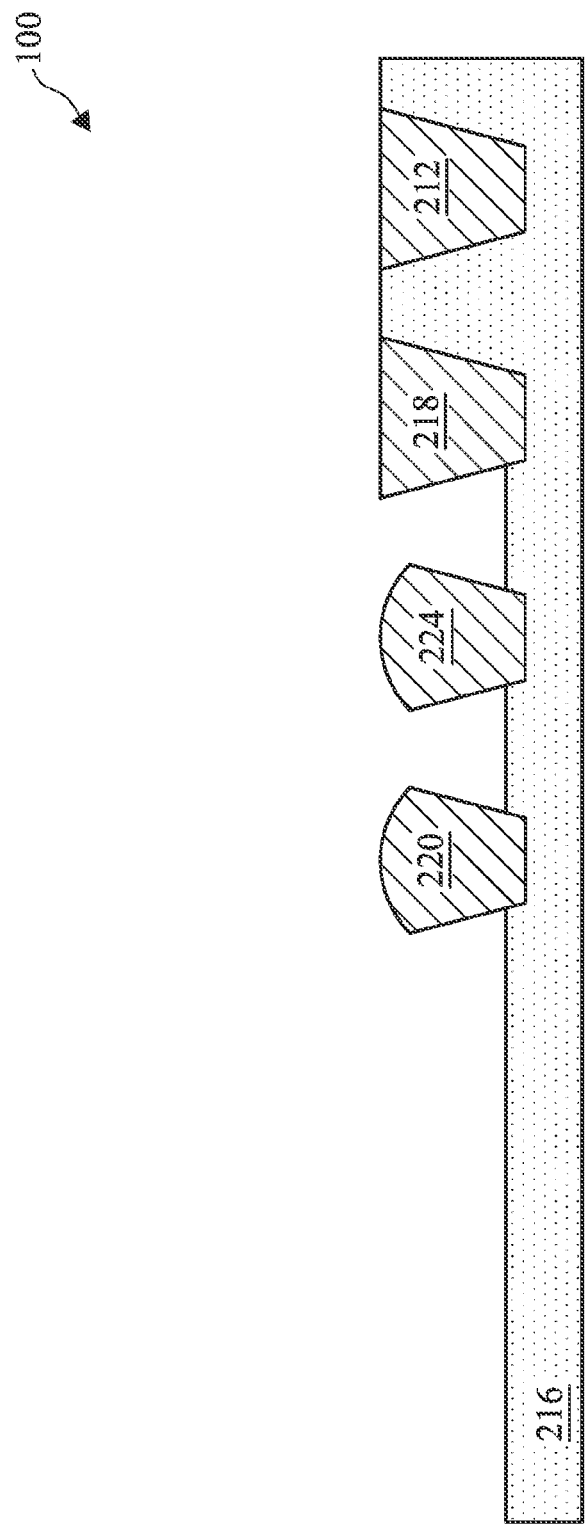
FIG. 10 illustrates a cross sectional view of the semiconductor device shown in FIG. 9 after a cleaning process and a hard mask removal process are applied to the semiconductor device in accordance with various embodiments of the present disclosure.

FIG. 10 illustrates a cross sectional view of the semiconductor device shown in FIG. 9 after a cleaning process and a hard mask removal process are applied to the semiconductor device in accordance with various embodiments of the present disclosure. A cleaning process may be employed to remove any remaining residues generated in the etching process shown in FIG. 9.

The remaining hard mask layer 602 shown in FIG. 9 may be removed using, for example, a wet etch process, a dry etch process or other suitable processes. In some embodiments, the remaining hard mask layer 602 is removed by a wet etch process. The wet etching process may be performed using an etchant comprising diluted hydrofluoric acid (dHF) and/or the like.

Figure 11:
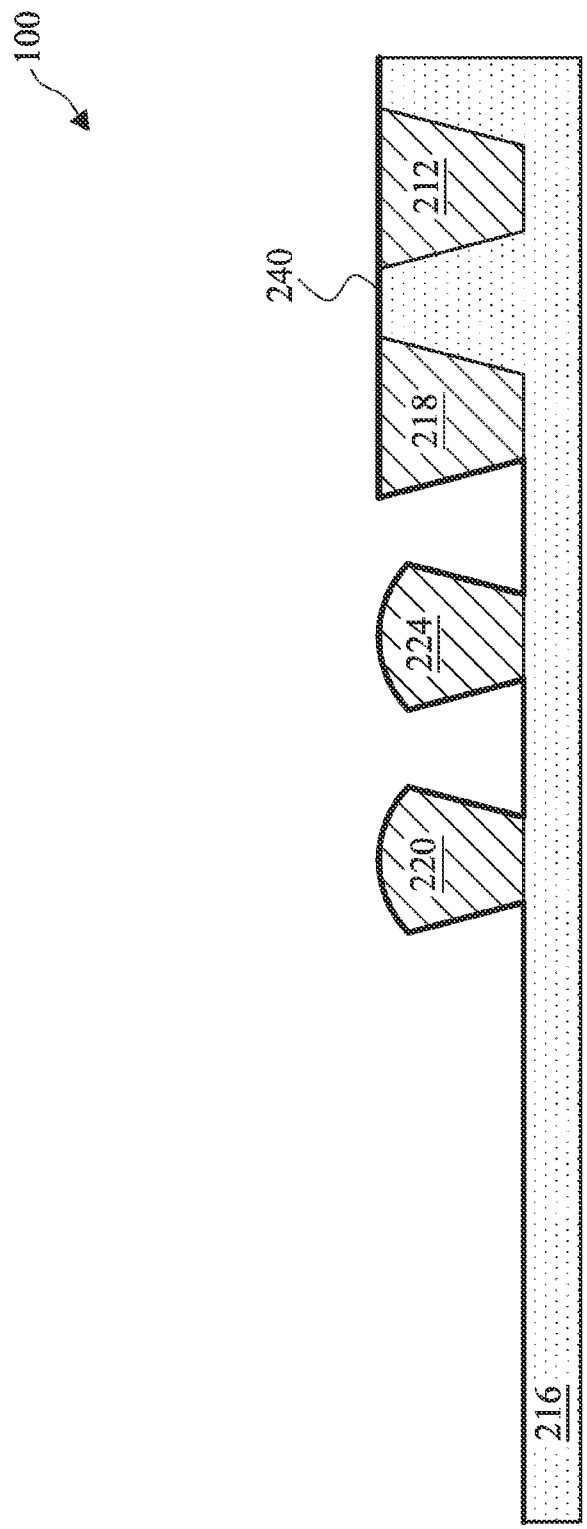
FIG. 11 illustrates a cross sectional view of the semiconductor device shown in FIG. 10 after an etch stop layer is formed over the semiconductor device in accordance with various embodiments of the present disclosure.

FIG. 11 illustrates a cross sectional view of the semiconductor device shown in FIG. 10 after an etch stop layer is formed over the semiconductor device in accordance with various embodiments of the present disclosure. The etch stop layer 240 may be formed over the exposed portions of the semiconductor device as shown in FIG. 11. The etch stop layer 240 may be a dielectric material such as such as silicon nitride, silicon oxynitride, silicon oxycarbide, silicon carbide, combinations thereof, and multi-layers thereof. In some embodiments, the etch stop layer 240 may be formed using a suitable deposition process such as CVD, PECVD, ALD and/or the like. The etch stop layer 240 may be of a thickness in a range from about 300 Angstroms to about 1,500 Angstroms.

Figure 12:
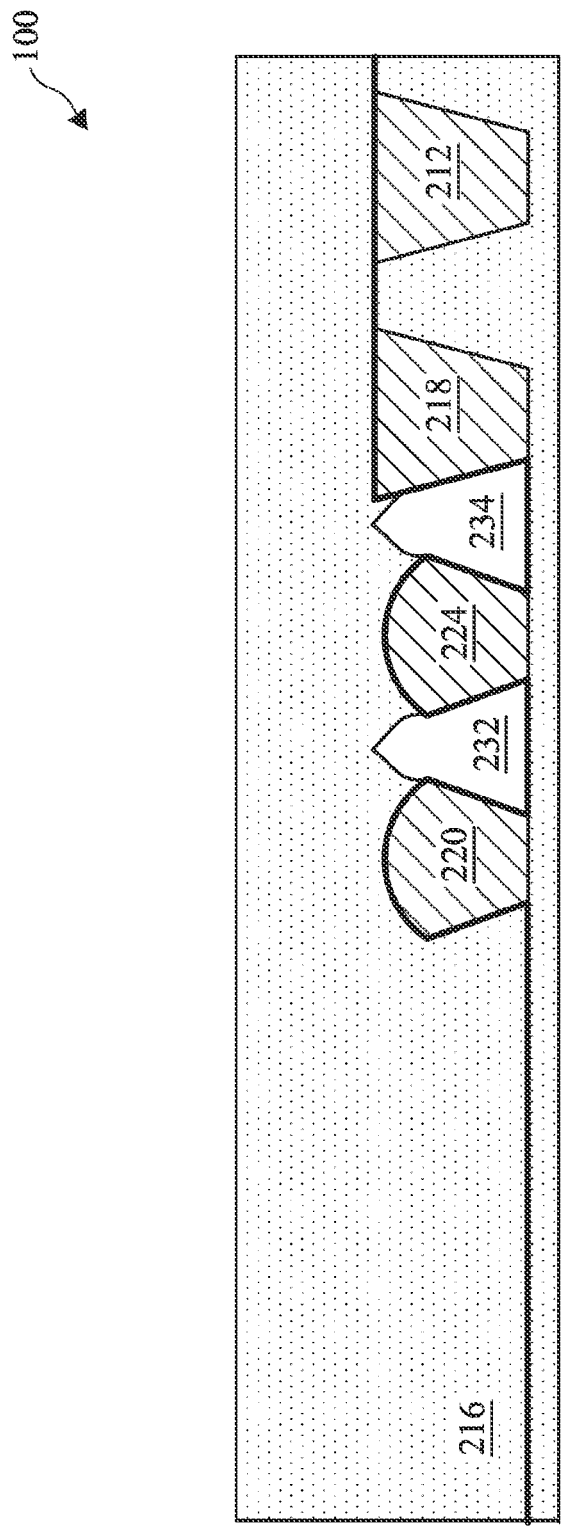
FIG. 12 illustrates a cross sectional view of the semiconductor device shown in FIG. 11 after air gaps are formed in accordance with various embodiments of the present disclosure.

FIG. 12 illustrates a cross sectional view of the semiconductor device shown in FIG. 11 after air gaps are formed in accordance with various embodiments of the present disclosure. A dielectric material may be deposited over the semiconductor device 100 through suitable deposition techniques such as a conformal deposition technique. The dielectric material may be the same as the material of the dielectric layer 216. Throughout the description, the newly added dielectric material and the existing material in the layer 216 may be collectively called as the dielectric layer 216.

As shown in FIG. 12, after the dielectric layer 216 is deposited over the semiconductor device, two air gaps 232 and 234 may be formed due to the higher aspect ratio (i.e., the ratio between the gap height and gap width) of the openings between two adjacent metal lines. As shown in FIG. 12, the narrow gap width may result in overhangs formed in the upper portions of the gap. Such overhangs may prevent the dielectric material from filling the openings so that air gaps 232 and 234 are formed as shown in FIG. 12.

As shown in FIG. 12, the top surfaces of the air gaps 232 and 234 are of a teardrop shape. It should further be noted that the shape shown in FIG. 12 is selected purely for demonstration purposes and are not intended to limit the various embodiments of the present disclosure. For example, it is within the scope and spirit of the present disclosure for the air gaps 232 and 234 to comprise other shapes, such as, but no limited to oval, square, triangle and/or the like.

One advantageous feature having the air gaps 232 and 234 shown in FIG. 12 is that the air in the air gaps 232 and 234 exhibits a permittivity approximately equal to 1. Such a low permittivity helps to further reduce the capacitive coupling between adjacent metal lines (e.g., metal lines 220 and 224). Such reduced capacitive coupling may help to improve reliability characteristics including VBD, TDDB, lower leakage and/or the like.

Figure 13:
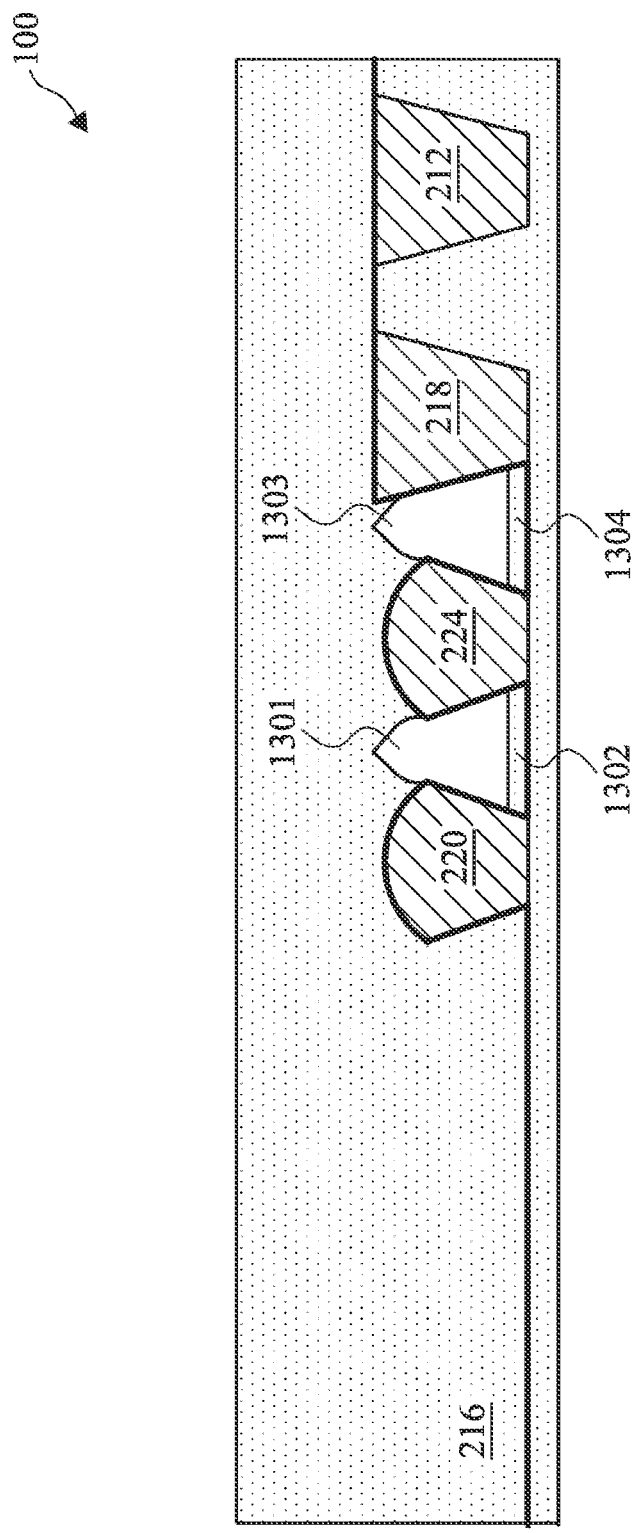
FIG. 13 illustrates a cross sectional view of the air gaps in accordance with another embodiment of the present disclosure.

FIG. 13 illustrates a cross sectional view of the air gaps in accordance with another embodiment of the present disclosure. The air gaps 1301 and 1303 shown FIG. 13 are similar to air gaps 232 and 234 shown in FIG. 12 except that some dielectric materials may fall through the narrow gaps between two adjacent metal lines during the dielectric deposition process. As a result, a first dielectric bottom layer 1302 is formed in the air gap 1301. Likewise, a second dielectric bottom layer 1304 is formed in the air gap 1303.

Figure 14:
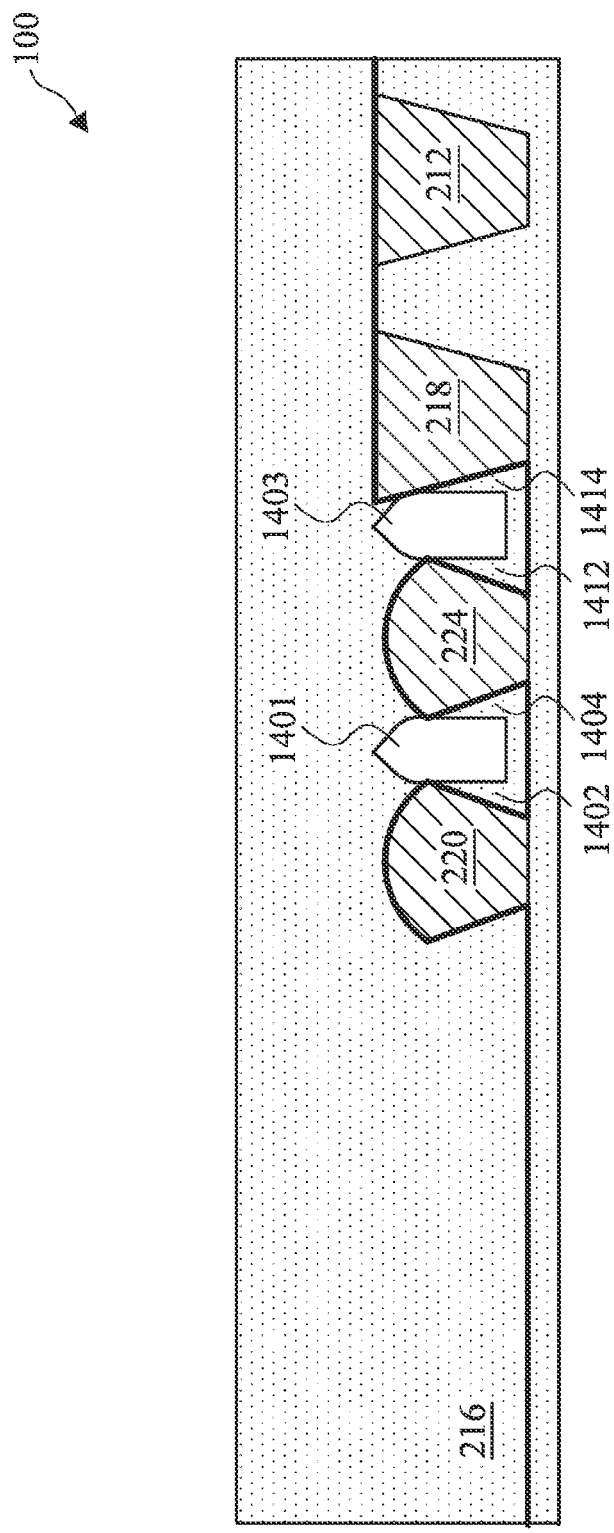
FIG. 14 illustrates a cross sectional view of the air gaps in accordance with yet another embodiment of the present disclosure.

FIG. 14 illustrates a cross sectional view of the air gaps in accordance with yet another embodiment of the present disclosure. The air gaps 1401 and 1403 shown FIG. 14 are similar to air gaps 1301 and 1303 shown in FIG. 13 except that two dielectric sidewalls are formed in the air gaps 1401 and 1403 during the dielectric deposition process. As shown in FIG. 14, there may be two dielectric sidewalls 1402 and 1404 formed in the air gap 1401. Likewise, dielectric sidewalls 1412 and 1414 are formed in the air gap 1403.

Figure 15:
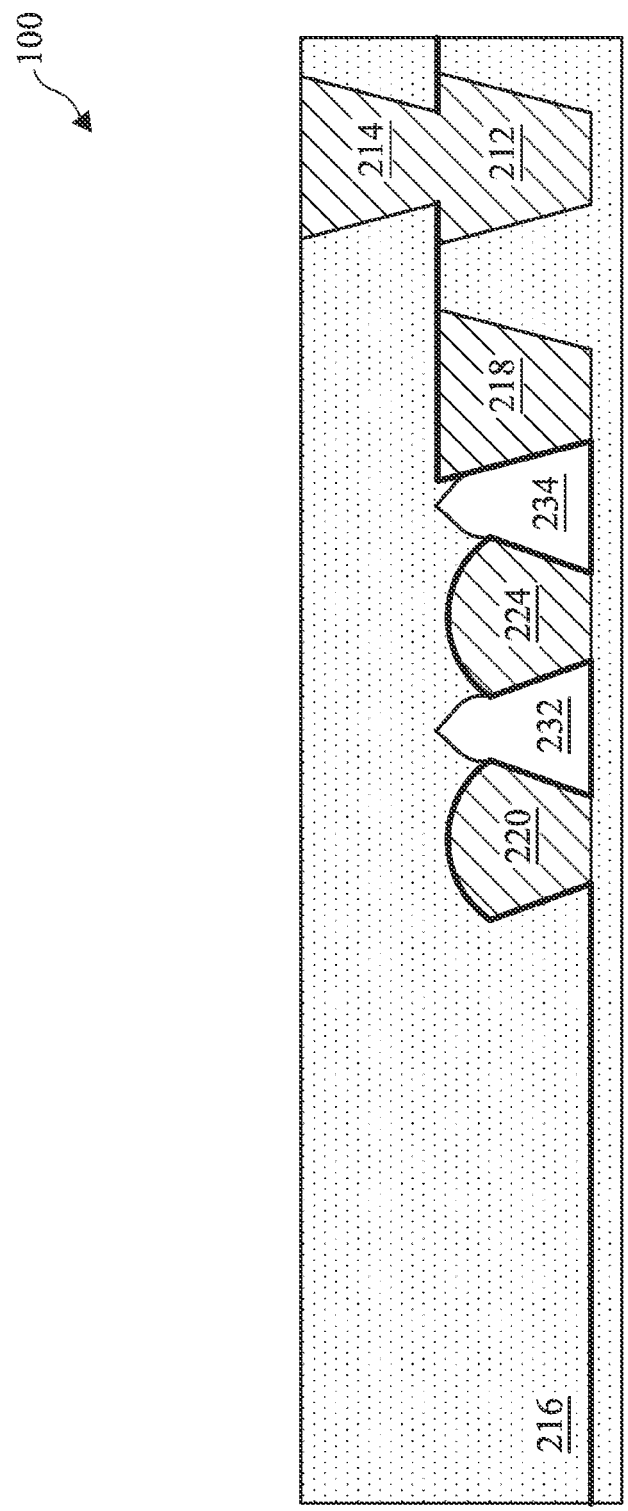
FIG. 15 illustrates a cross sectional view of the semiconductor device shown in FIG. 12 after a via is formed in accordance with various embodiments of the present disclosure.

FIG. 15 illustrates a cross sectional view of the semiconductor device shown in FIG. 12 after a via is formed in accordance with various embodiments of the present disclosure. The via 214 is formed over the metal line 212. The via 214 may be formed using a suitable semiconductor fabrication process. For example, a mask layer is deposited onto the surface of the dielectric layer 216. An opening is formed through an etching process. A conductive material (such as tungsten or copper) is filled in the opening to form the via 214.

It should be noted that other methods and materials that are known in the art could also be used to form the via 214. It should further be noted that the via 214 may comprise other suitable conductive layers. For example, the via 214 may include barrier layers, adhesive layers, multiple conductive layers and/or the like.

Figure 16:
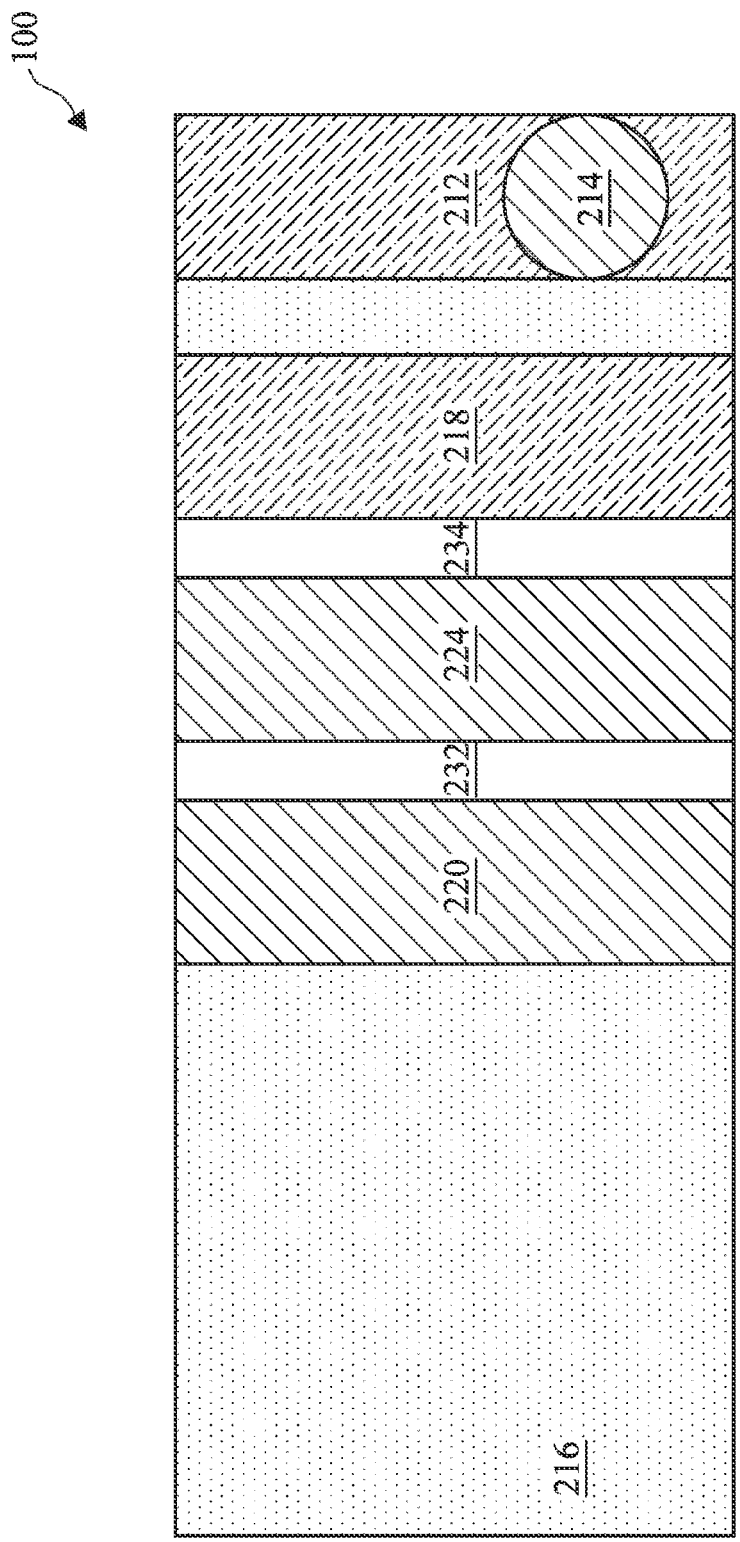
FIG. 16 illustrates a top view of the semiconductor device shown in FIG. 15 in accordance with various embodiments of the present disclosure.

FIG. 16 illustrates a top view of the semiconductor device shown in FIG. 15 in accordance with various embodiments of the present disclosure. Metal lines 220 and 224 are of rounded top surfaces. Metal lines 212 and 218 are of planar top surfaces. The air gap 232 is between metal line 220 and metal line 224. The air gap 234 is between metal line 224 and metal line 218. The via 214 is formed over the metal line 212.

Figure 17:
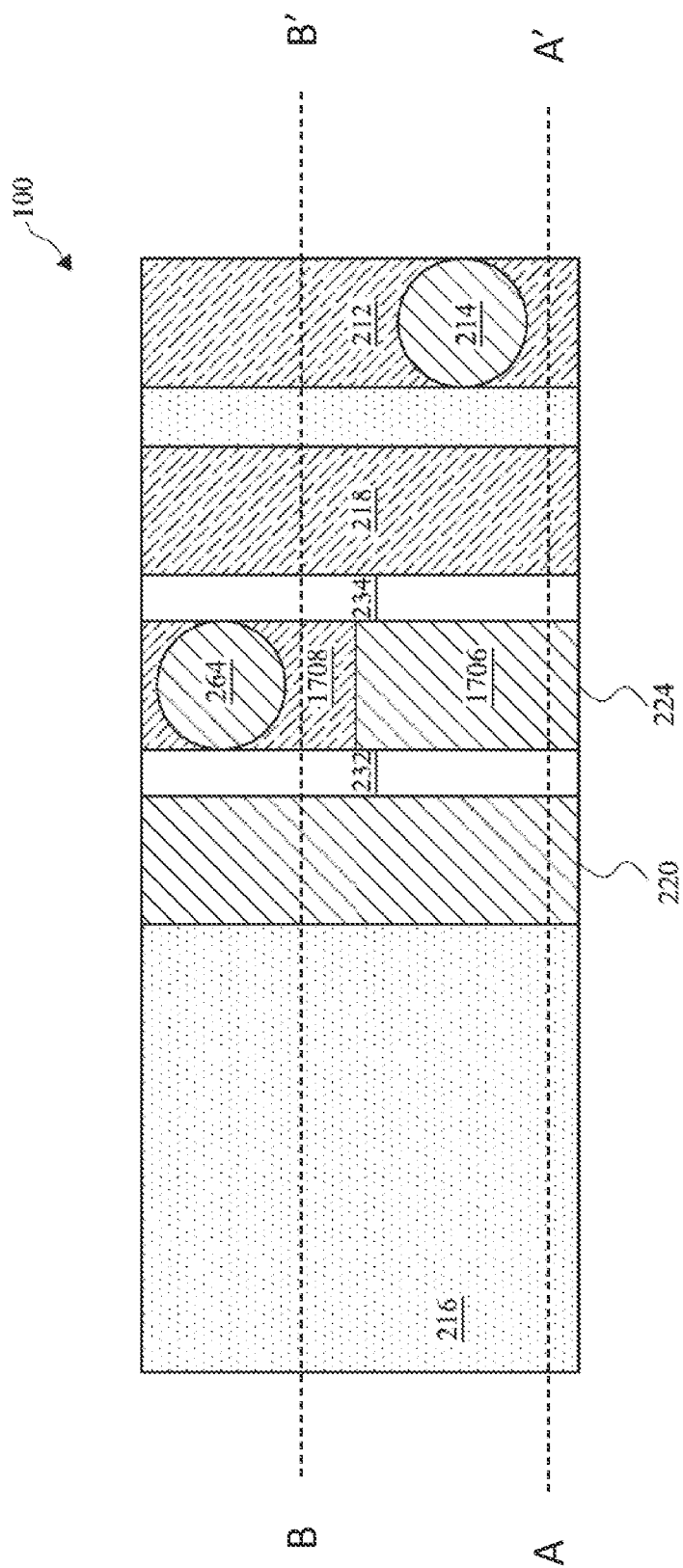
FIG. 17 illustrates a top view of the semiconductor device shown in FIG. 15 in accordance with another embodiment of the present disclosure.
Figure 19:
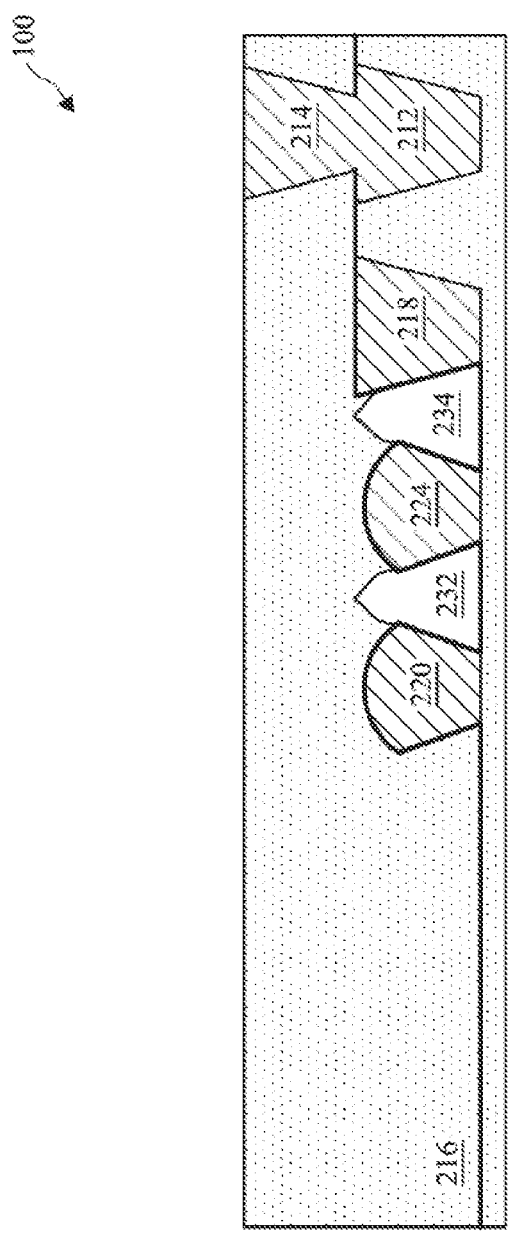
FIG. 19 illustrates a cross sectional view taken along line A-A' of FIG. 17.
Figure 20:
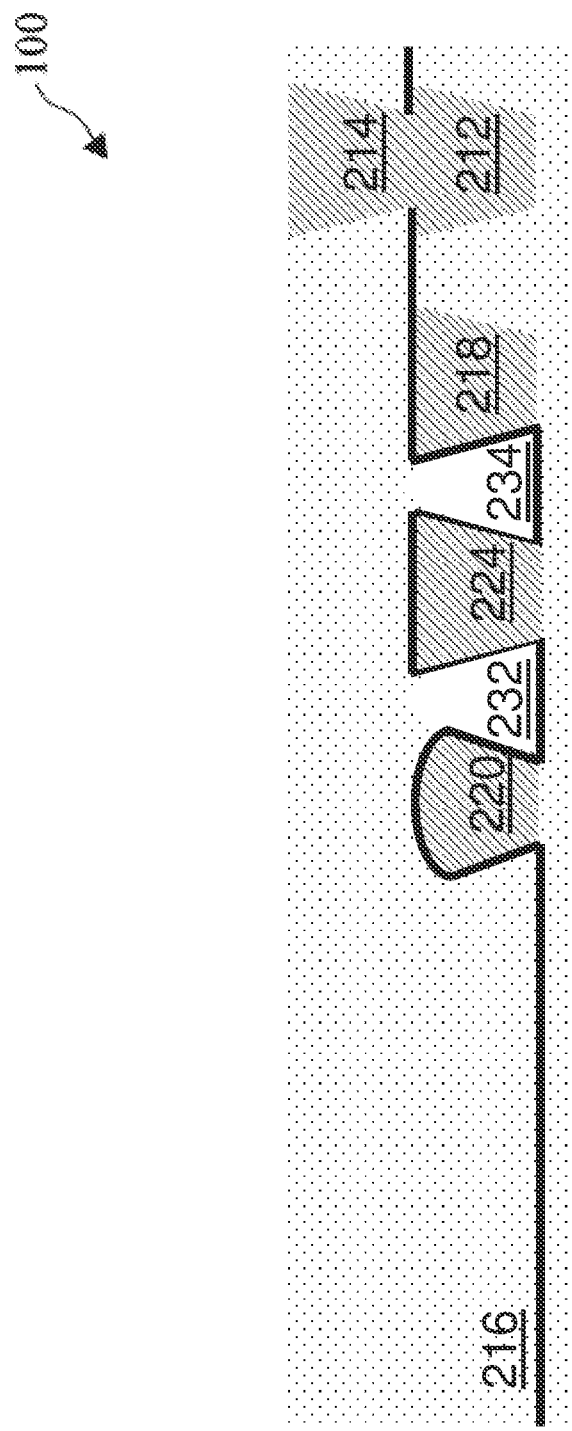
FIG. 20 illustrates a cross sectional view taken along line B-B' of FIG. 17.

FIG. 17 illustrates a top view of the semiconductor device shown in FIG. 15 in accordance with another embodiment of the present disclosure. The metal line 220 is of a rounded top surface. The metal line 224 comprises a rounded surface portion 1706 and a planar surface portion 1708. As shown in FIG. 17, the air gap 232 is between metal lines 220 and 224. The air gap 234 is between the metal line 224 and metal line 218. The via 214 is formed over the metal line 212. There may be a second via 264 formed over the planar surface portion of the metal line 224. FIG. 19 illustrates a cross sectional view taken along line A-A' of FIG. 17. FIG. 20 illustrates a cross sectional view taken along line B-B' of FIG. 17.

Figure 18:
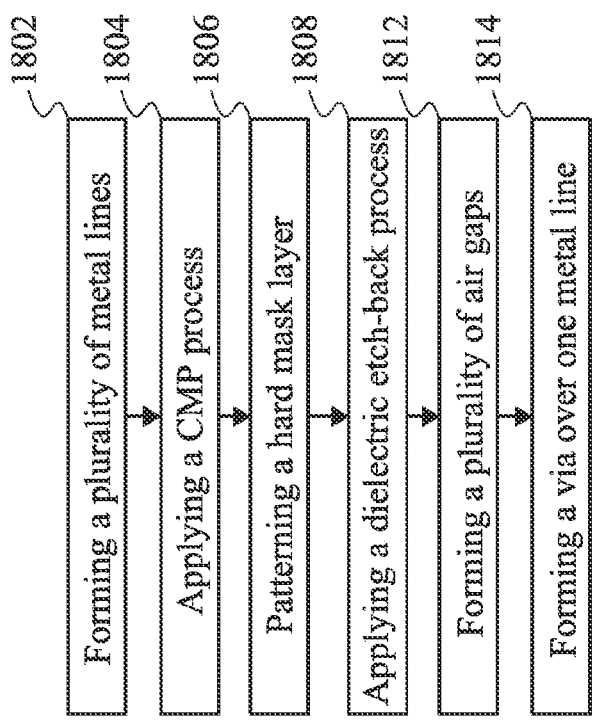
FIG. 18 illustrates a flow chart of a method for forming the semiconductor device shown in FIG. 1 in accordance with various embodiments of the present disclosure.

FIG. 18 illustrates a flow chart of a method for forming the semiconductor device shown in FIG. 1 in accordance with various embodiments of the present disclosure. This flowchart is merely an example, which should not unduly limit the scope of the claims. One of ordinary skill in the art would recognize many variations, alternatives, and modifications. For example, various step as illustrated in FIG. 18 may added, removed, replaced, rearranged and repeated.

At step 1802, a plurality of metal lines may be formed in a metallization layer over a substrate. At step 1804, a CMP process is applied to the excess material until the top surfaces of the metal lines are substantially level with the top surface of the metallization layer.

At step 1806, a hard mask layer is formed over the metallization layer. The hard mask layer is patterned to expose the top surfaces of two metal lines in a non-via landing region. At step 1808, a suitable dielectric etch-back process such as a RIE process is applied to the exposed portion of the metallization layer. The plasma bombardment in the dielectric etch-back process knocks off some materials from the exposed surface of the metal lines in the non-via landing region, thereby forming two rounded metal lines. The dielectric etch-back process also removes the dielectric material between two rounded metal lines during the same fabrication step.

At step 1812, two air gaps are formed through depositing additional dielectric materials over the rounded metal lines. At step 1814, a via is formed over a metal line in a via landing region.

In accordance with an embodiment, a method comprises forming a first metal line and a second metal line in a dielectric layer over a substrate, each having a planar top surface, depositing a mask layer over the first metal line and the second metal line, patterning the mask layer to expose the first metal line, applying an etching process to the first metal line and the dielectric layer until a portion of the dielectric layer between the first metal line and the second metal line has been removed, and the first metal line has a rounded top surface and two rounded corners and depositing a dielectric material over the first metal line and the second metal line to form an air gap between the first metal line and the second metal line.

In accordance with an embodiment, a method comprises forming a first metal line, a second metal line and a third metal line in a dielectric layer over a substrate, each having a planar top surface, depositing a hard mask layer over top surfaces of the first metal line, the second metal line and the third metal line, patterning the hard mask layer to expose the top surfaces of the first metal line and the second metal line, wherein a remaining portion of the hard mask layer covers the third metal line, applying an etching process to the first metal line, the second metal line and the dielectric layer until forming a first rounded top surface at the first metal line and a second rounded top surface at the second metal line, removing the remaining portion of the hard mask layer and depositing a dielectric material over the first metal line, the second metal line and the third metal line to form a first air gap between the first metal line and the second metal line, and a second air gap between the second metal line and the third metal line.

In accordance with an embodiment, a method comprises forming a first conductive line and a second conductive line in a first dielectric layer over a substrate, each having a planar top surface, applying an etch-back process to the first dielectric layer until a dielectric portion between the first conductive line and the second conductive line has been removed, and the first conductive line and the second conductive line have respective cross sectional shapes including a rounded surface and two rounded corners and depositing a second dielectric layer over the substrate, while leaving a first air gap between the first conductive line and the second conductive line.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first dielectric layer over a substrate;
   a first metal line and a second metal line over the first dielectric layer, wherein the first metal line comprises a rounded top surface, wherein the second metal line comprises a planar top surface, and wherein the planar top surface is above the rounded top surface in a first direction perpendicular to a major surface of the substrate;
   an etch stop layer disposed on opposite sidewalls of the first metal line and on a first sidewall of the second metal line, wherein a bottom of the first metal line is in contact with the first dielectric layer, and a bottom and a second sidewall of the second metal line opposite the first sidewall of the second metal line are in contact with the first dielectric layer;
a first air gap between the first metal line and the second metal line, wherein a peak of the first air gap is above the rounded top surface of the first metal line in the first direction; and
a second dielectric layer over the first metal line, the second metal line, the etch stop layer, and the first dielectric layer, the second dielectric layer sealing the first air gap, wherein a first portion of the second dielectric layer is below the rounded top surface of the first metal line in the first direction.

2. The device of claim 1, wherein the etch stop layer is disposed on a first horizontal surface and a second horizontal surface of the first dielectric layer, wherein the first horizontal surface is disposed at a different level in the first direction from the second horizontal surface.

3. The device of claim 1, wherein a bottom surface and side surfaces of the first air gap are defined by the etch stop layer and a top surface of the first air gap is defined by the second dielectric layer.

4. The device of claim 1, wherein side surfaces of the first air gap are defined by the etch stop layer and a bottom surface and a top surface of the first air gap are defined by the second dielectric layer.

5. The device of claim 1, wherein side surfaces of the first air gap are defined by the etch stop layer and the second dielectric layer and a bottom surface and a top surface of the first air gap are defined by the second dielectric layer.

6. The device of claim 1, wherein the first metal line comprises a first portion comprising the rounded top surface, wherein the first metal line further comprises a second portion comprising a planar top surface.

7. The device of claim 6, wherein the planar top surface of the first metal line extends above the rounded top surface of the first metal line in the first direction.

8. A device comprising:
a first metal line in a metallization layer over a semiconductor substrate;
a second metal line in the metallization layer, wherein a first top surface of the first metal line is level with a second top surface of the second metal line;
a first air gap between the first metal line and the second metal line, wherein at least a portion of the first metal line and at least a portion of the second metal line extend over the first air gap;
a third metal line in the metallization layer, wherein:
a third top surface of the third metal line is above the second top surface in a first direction perpendicular to a major surface of the semiconductor substrate; and
a first bottom surface of the first metal line is level with a second bottom surface of the second metal line and a third bottom surface of the third metal line in the first direction;
a second air gap between the second metal line and the third metal line, where at least a portion of the second metal line and at least a portion of the third metal line extend over the second air gap; and
a first dielectric layer over the first metal line, the second metal line, and the third metal line, wherein a first portion of the first dielectric layer is below the first top surface and the second top surface in the first direction and between the first metal line and the second metal line, and wherein a second portion of the first dielectric layer is below the second top surface and the third top surface in the first direction and between the second metal line and the third metal line.

9. The device of claim 8, wherein the third top surface of the third metal line is planar.

10. The device of claim 9, wherein the first top surface of the first metal line and the second top surface of the second metal line are rounded.

11. The device of claim 10, wherein the first top surface of the first metal line and the second top surface of the second metal line are convex.

12. The device of claim 8, wherein the second metal line further comprises a fourth top surface, wherein the fourth top surface is level with the third top surface.

13. The device of claim 8, further comprising a second dielectric layer over the semiconductor substrate, wherein the first metal line, the second metal line, and the third metal line are over the second dielectric layer, wherein the second dielectric layer contacts a first sidewall of the third metal line.

14. The device of claim 13, further comprising an etch stop layer over the second dielectric layer, the first metal line, the second metal line, and the third metal line, wherein the etch stop layer contacts the second dielectric layer, two sidewalls of the first metal line, two sidewalls of the second metal line, and a second sidewall of the third metal line.

15. A semiconductor device comprising:
a first conductive line over a substrate, the first conductive line extending in a first direction, wherein sidewalls of the first conductive line are linear in a cross-sectional view, wherein a first top surface of the first conductive line is curved in the cross-sectional view;
a second conductive line over the substrate, the second conductive line extending in the first direction, wherein sidewalls of the second conductive line are linear in the cross-sectional view and a second top surface of the second conductive line is curved in the cross-sectional view;
a first air gap extending in the first direction between the first conductive line and the second conductive line, wherein at least a portion of the first conductive line and at least a portion of the second conductive line extend over the first air gap; and
a first dielectric layer, the first dielectric layer comprising a first portion over the first conductive line, the second conductive line, and the first air gap, the first dielectric layer comprising a second portion between the first conductive line and the second conductive line, the second portion being below the first top surface and the second top surface, the second portion being discontinuous from the first portion.

16. The semiconductor device of claim 15, wherein a third top surface of the first conductive line is linear in the cross-sectional view.

17. The semiconductor device of claim 16, wherein the third top surface is disposed above the first top surface and the second top surface.

18. The semiconductor device of claim 17, wherein a topmost surface of the first air gap is disposed above the first top surface and the second top surface and level with the third top surface.

19. The semiconductor device of claim 16, further comprising a via over and in contact with the third top surface.

20. The semiconductor device of claim 15, wherein the first top surface is level with the second top surface.

* * * * *